(12) United States Patent
Shelley et al.

(10) Patent No.: US 7,375,613 B2
(45) Date of Patent: May 20, 2008

(54) PASSIVE ENTRY SENSOR SYSTEM

(75) Inventors: Michael J. Shelley, West Lothian (GB); Alex Crawford, East Kilbride (GB); Pascal Schweizer, Saint Martin d'Uriage (FR); Adrian Kettle, Swindon (GB); Marek Gierczak, Meylan (FR)

(73) Assignee: Honeywell International Inc., Morristown, NJ (US)

( * ) Notice: Subject to any disclaimer, the term of this patent is extended or adjusted under 35 U.S.C. 154(b) by 281 days.

(21) Appl. No.: 11/157,896

(22) Filed: Jun. 21, 2005

(65) Prior Publication Data

US 2006/0232379 A1    Oct. 19, 2006

Related U.S. Application Data

(60) Provisional application No. 60/671,943, filed on Apr. 15, 2005.

(51) Int. Cl.
*G05B 19/00* (2006.01)
*G06M 7/00* (2006.01)
*B60R 25/00* (2006.01)

(52) U.S. Cl. .................. 340/5.72; 340/5.62; 340/556; 250/221

(58) Field of Classification Search ............... 340/5.72, 340/426.36, 556, 5.62; 370/5.62; 250/221
See application file for complete search history.

(56) References Cited

U.S. PATENT DOCUMENTS

| | | | |
|---|---|---|---|
| 6,190,022 B1 * | 2/2001 | Tocci et al. ................. | 362/259 |
| 6,218,933 B1 | 4/2001 | Josserand et al. | |
| 6,246,808 B1 * | 6/2001 | Mallon ........................ | 385/16 |
| 6,416,208 B2 * | 7/2002 | Pastrick et al. ............. | 362/494 |
| 7,071,920 B2 * | 7/2006 | Bohn .......................... | 345/163 |
| 2004/0031908 A1 * | 2/2004 | Neveux et al. ............. | 250/221 |

FOREIGN PATENT DOCUMENTS

| | | |
|---|---|---|
| DE | 4212291 A1 | 10/1993 |
| DE | 19843594 A1 | 4/2000 |
| DE | 10240850 A1 | 3/2004 |
| FR | 2772818 A1 | 6/1999 |
| FR | 2807090 A1 | 10/2001 |

\* cited by examiner

*Primary Examiner*—Brian Zimmerman
*Assistant Examiner*—Yong Hang Jiang
(74) *Attorney, Agent, or Firm*—Matthew F. Lambrinos; Luis M. Ortiz; Kermit D. Lopez

(57) ABSTRACT

Passive entry sensor systems and associated sensors are disclosed. The system sensor is locatable in the handle of a door or like structure and can provide an electromagnetic radiation beam transmitted either along the length of the handle between opposite ends thereof or between the handle and the door such that the sensor can detect at least a partial interruption of the beam by a user actuating the handle. The system can include an independent optical locking switch for actuation by a user to lock the door which locking switch comprises a shutter for intercepting the beam so as to flag the sensor. The system can include a power-up switch for actuation by a user to power-up the system, back-up switches for detecting a pull on the handle, indicators for indicating system status to the user, and backlight and ground light lighting.

13 Claims, 4 Drawing Sheets

PASSIVE ENTRY SENSOR SYSTEM

CROSS-REFERENCE TO PROVISIONAL PATENT APPLICATION

This patent application claims priority under 35 U.S.C. § 119(e) to provisional patent application Ser. No. 60/671,943 entitled "Passive Entry Sensor System," which was filed on Apr. 15, 2005 with the U.S. Patent & Trademark Office, the disclosure of which is incorporated herein by reference.

TECHNICAL FIELD

Embodiments are generally related to sensing devices and applications and, in particular, to sensor devices and systems for use in keyless access systems which operate passively to enable access by an authorized user to secured environments. Embodiments are additionally related to multi-functional passive entry sensors and systems. Embodiments are also related to passive entry sensors and system configurations utilized in automotive applications.

BACKGROUND OF THE INVENTION

It is important, for many reasons, to control access to premises, vehicles and personal property so that only authorized users are allowed access. Typically this is done using keys which fit a lock to allow the user of the key to open the lock and gain entry. One problem with the existing key and lock arrangements is that loss or damage to the key can render access impossible. In addition, if the key lock itself is blocked or damaged this can also prevent access. One other problem is that the use of a key requires a specific action such as unlocking a latch with the key from the authorized person before an action of opening the door. This specific action is very often not easy to do, not ergonomic and is time-consuming.

A number of ways have been proposed to try to overcome these disadvantages. With security devices for cars, it is well known that a keyless fob can be used, such that actuation of a button on the fob generates an infrared (IR) or radio frequency (RF) signal which is detected by a sensor in the vehicle which unlocks the doors. A key is still required by the user in order to operate the ignition system. The fob also contains a lock button which generates a similar IR or RF signal to lock the vehicle. Such vehicle keyless access systems have been known for a number of years. Such systems operate on the basis that when the IR or RF "open" signal is generated by the fob, the signal is used to actuate a mechanism which unlocks the car door so that when the user pulls on the handle, the door is already unlocked. Similar arrangements may be used for building entry.

One problem with this arrangement is that the user still has to initiate a specific action such as, in the case of a fob, taking the fob in his hand and pressing on the fob button, or in the case of a magnetic card or the like, inserting the card in a slot or to present it in front of a card reader/detector or the like, in order to unlock the door and have access to the vehicle, these specific actions being time-consuming and not ergonomic.

One other problem with this arrangement is that if the user decides not to enter the vehicle but forgets to actuate the "lock" signal, the car and/or building remains open and is thus vulnerable. In addition, with existing keyless locking systems, particularly for vehicles, a conventional locking mechanism is used which is susceptible to interference by thieves to gain access to the car. For buildings, conventional locks are actuated in the same way and are susceptible to the same procedures by intruders to gain access to the premises.

A passive entry sensor system for use in a keyless access system used in automotive applications transmits a beam of light from a sensor that is bracket-mounted and spaced behind the door skin. The beam of light strikes a lens protector mounted on the door skin, where the beam is deflected towards a mirror mounted on the door handle. On striking the mirror, the beam is reflected back to the lens protector where it is deflected into the sensor and detected. Alternatively, the bracket-mounted sensor can be configured to provide a beam from one end of the handle to the other by optically coupling the bracket-mounted sensor to the handle using light guides.

Such passive entry sensor systems are expensive to implement, particularly in automotive applications, as a result of high piece part count and assembly time. Furthermore, in order to use such systems, extensive modification of the door skin of the vehicle is necessary. Also, the functionality of such sensors is limited.

There is a need to provide a more cost effective passive entry sensor system. There is also a need to provide a multi-functional passive entry sensor system. Additionally, more efficient passive entry sensors and systems are necessary which can be used to open doors, access panels or the like in a range of applications.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect of the present invention to provide for improved sensor devices and applications.

It is another aspect of the present invention to provide for improved passive entry sensors and systems.

It is a further aspect of the present invention to provide for multi-functional passive entry sensors and systems.

It is an additional aspect of the present invention to provide for an improved passive entry sensor and system which can be utilized with an access control system for allowing access to a vehicle.

The aforementioned aspects of the invention and other objectives and advantages can now be achieved as described herein. Passive entry sensor systems comprising sensors mounted in handles of doors or the like are disclosed.

The sensor system comprises a sensor having an electromagnetic radiation emitter, such as an infra red (IR) light emitting diode (LED), for transmitting a beam of electromagnetic radiation and an electromagnetic radiation detector, such as an IR photo-detector, for detecting the electromagnetic radiation beam. The emitter and detector are located in an optical enclosure of the sensor. At least a portion of the optical enclosure is mountable in a handle of a door or like structure such that the sensor can detect at least a partial interruption or other change in transmission of the beam caused by the user actuating the handle. The senor can be configured to provide an output control signal in response detecting the change in transmission which signal can be provided to an access control mechanism, such as for example a computer processing unit (CPU) of a vehicle, to unlock the door. Mounting at least a portion of the optical enclosure in the handle itself avoids the need to use light pipes to optically couple the sensor to the handle. This arrangement therefore simplifies construction of the passive entry sensor system in the door handle assembly.

At least a portion of the optical enclosure can be locatable at or adjacent one end of a door handle whereby the emitted beam can be transmitted along the length of the handle and reflected back to the sensor. The system can include a beam reflector locatable at or adjacent an opposing end of said handle such that the detector can detect the reflected emitted beam. Alternatively, the optical enclosure is locatable in the handle between opposing ends thereof whereby the emitted beam can be transmitted beneath the handle towards the door and can be reflected back to the handle and detected by the detector.

The system can include an independent optical locking switch having a shutter for intercepting and controlling transmission of the beam. The sensor can be configured to detect at least a partial interruption or other change in transmission of the beam caused by actuation of the shutter. By providing an independent locking switch that is operable by the user for locking the door, the functionality of the sensor system is improved. Moreover, utilizing a shutter in the locking switch to control transmission of the beam such that the sensor detects actuation of the locking switch, obviates the need to utilize a microswitch and associated circuitry to provide the output control signal for locking the door. Consequently, this arrangement simplifies construction of the passive entry sensor system and reduces manufacturing costs and assembly time.

The sensor can include a signal processor coupled to the detector such that the processor detects the interruption or other change in beam transmission caused by either the user actuating the handle or actuating the locking device and provides corresponding output signals to the access control mechanism to unlock/lock the door.

The independent optical locking switch can include a switch member, such as a button or lever, coupled or connected to the shutter, for actuation by a user to operate the shutter. The sensor can therefore detect the change in beam transmission caused by a user actuating the switch member and can provide a corresponding output control signal to a control module, such as the CPU of the vehicle, for locking the door.

The shutter can be mounted to the handle or sensor and can be actuated to intercept the beam being transmitted from the optical enclosure of the sensor to change the transmission of the beam.

The passive entry sensor system may be provided with further functionality by including at least one of the following features: power-up switch, a back-up switch, at least one indicator, a backlight and a ground light.

The power-up switch can be included in the sensor for activation by a user to provide a signal to the control module to power up the passive entry system. The power up switch can be arranged on the sensor and operatively coupled to the switch member such that actuation of the switch member triggers the power-up switch. The passive entry system, after being powered down, can be reactivated by actuating the power-up switch as required. The power-up switch provides further functionality to the system and is advantageous in that it allows power consumption of the passive sensor system to be limited.

The switch member can be coupled or connected to the shutter and power-up switch such that the shutter can be actuated by moving the switch member to a first position and such that the power-up switch can be activated by moving the switch member to a second position. Utilizing the same switch member to selectively operate the locking switch and power-up switch further minimizes the number of components parts of the system.

The back-up switch can be included in the sensor to provide an output control signal for unlocking the door in the event that the user's hand actuating the handle is not detected by the sensor system for some reason.

Light sources, such as LEDs, can be located in the sensor optical enclosure for illuminating the switch member to indicate one or more system modes, such as alarm activated, right-left turn vehicle indication, locked or unlocked door status, and for providing back and/or ground lighting. Activation of the LEDs can be controlled by a control module, such as the vehicle CPU. The sensor can include one or more LEDs and one or more lens or other optical element for allowing passage of light from the sensor through one or more corresponding handle apertures such that, when the at least part of the optical enclosure is incorporated in the handle, the or each LED can illuminate the door beneath the hand and/or the ground below the handle to provide the back and/or ground lighting.

In an alternative arrangement of the system, the sensor optical enclosure is locatable in the handle for providing an emitted beam between the handle and the door. The reflector can be located on the door beneath the handle for reflecting the beam back to the sensor in the handle.

A method of keyless access to a door or like structure can be provided by the following steps: generating a beam of electromagnetic radiation, transmitting the electromagnetic radiation beam along the length of a handle or between a handle and a door or like structure, detecting the beam, at least partially interrupting or changing the beam transmission by a user actuating the handle to open the door, detecting at least a partial interruption or other change in transmission of the beam caused by a user actuating the handle, generating a first output signal in response to detecting the change in transmission caused by actuation of the handle, processing said first output signal to provide a first actuation signal, sending said first actuation signal to an access control mechanism to unlock or lock the door or like structure.

Additionally, the method can include the following steps: at least partially intercepting or changing the beam transmission by actuating a shutter, sensing the change in beam transmission caused by actuating the shutter, generating a second output signal in response to sensing the change in beam transmission caused by actuating the shutter, processing the second output signal to provide a second actuation signal, and sending the second actuation signal to an access control mechanism to lock the door or like structure. The method can include the steps of reflecting the beam from a reflector located on the handle or door and detecting the reflected beam.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate at least one embodiment of the present invention and are not intended to limit the scope of the invention.

Figure 1:
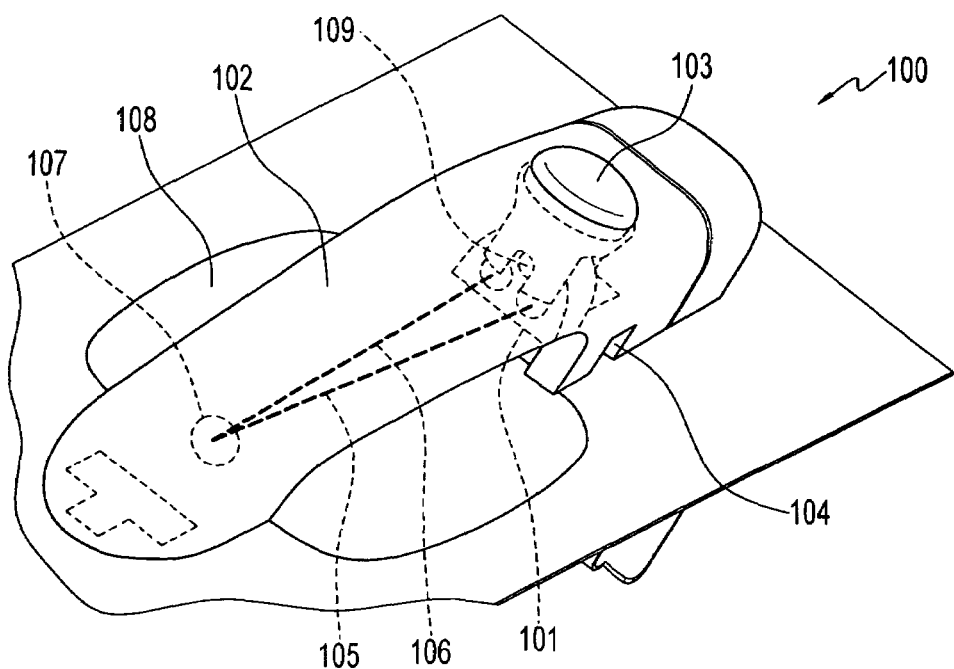
FIG. 1 illustrates a front perspective view of the passive entry sensor system arranged in a vehicle door handle assembly according to a preferred embodiment.

FIG. 1 of the accompanying drawing illustrates a front perspective view of the passive entry sensor system 100 arranged in a vehicle door handle assembly according to a preferred embodiment. The sensor system includes a sensor 101, a portion of which is mounted in an end of a door handle 102, and a reflector 107, such as a mirror or a flat painted area, located at an opposing end of the handle facing the sensor (all shown in dotted line). The sensor 101 is adapted to transmit an electromagnetic beam of radiation, in this case an IR beam 105, at an angle along the length of the handle to the reflector 107 and to detect the IR beam 106 reflected back by the reflector. The optical sensor 101 is configured to detect an interruption or other change in transmission of the beam 105,106 caused by a user's hand actuating the handle to open the door. An independent optical locking switch 103 is located in the same end of the handle as the sensor for actuation by a user wishing to lock the door. As will be described in more detail below, the locking switch 103 is adapted and arranged to interact with and trigger the sensor 101.

The sensor system 101 includes signal processor circuitry which detects the interruption or modification of the beam 105,106 and, anticipating a pull of the door handle, provides an output control signal to a control module, in this case a CPU of the vehicle, which generates an RF signal for interrogating a user's digital ID on a card. When satisfactory response is obtained, i.e. the user's head ID matches a stored digital ID, a control signal is generated by the control module to unlock a locking mechanism and allows the door to open.

Figure 2:
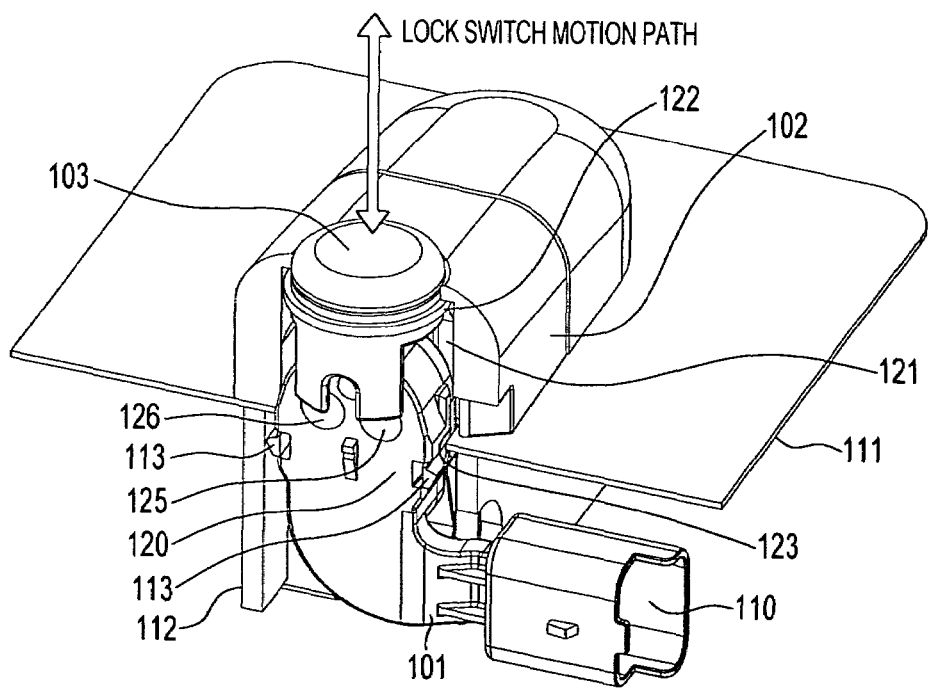
FIG. 2 illustrates a cut-away view of the handle end, taken transversely of the handle, incorporating the optical sensor and optical locking switch of the system in accordance with the first embodiment.

Referring to FIG. 2, which illustrates a cut away view of the handle end taken transversely of the handle incorporating the optical sensor and optical locking switch of the system in accordance with the first embodiment, the optical sensor includes an optical lens assembly 120 and a cover 121, made from molded plastic or other suitable material, cooperating to form an optical enclosure for the sensor components and associated circuitry, and an electrical interconnector 110, integrated with the optical enclosure 120,121 for connecting the sensor circuitry to the control module, in this case, the vehicle CPU.

Figure 5:
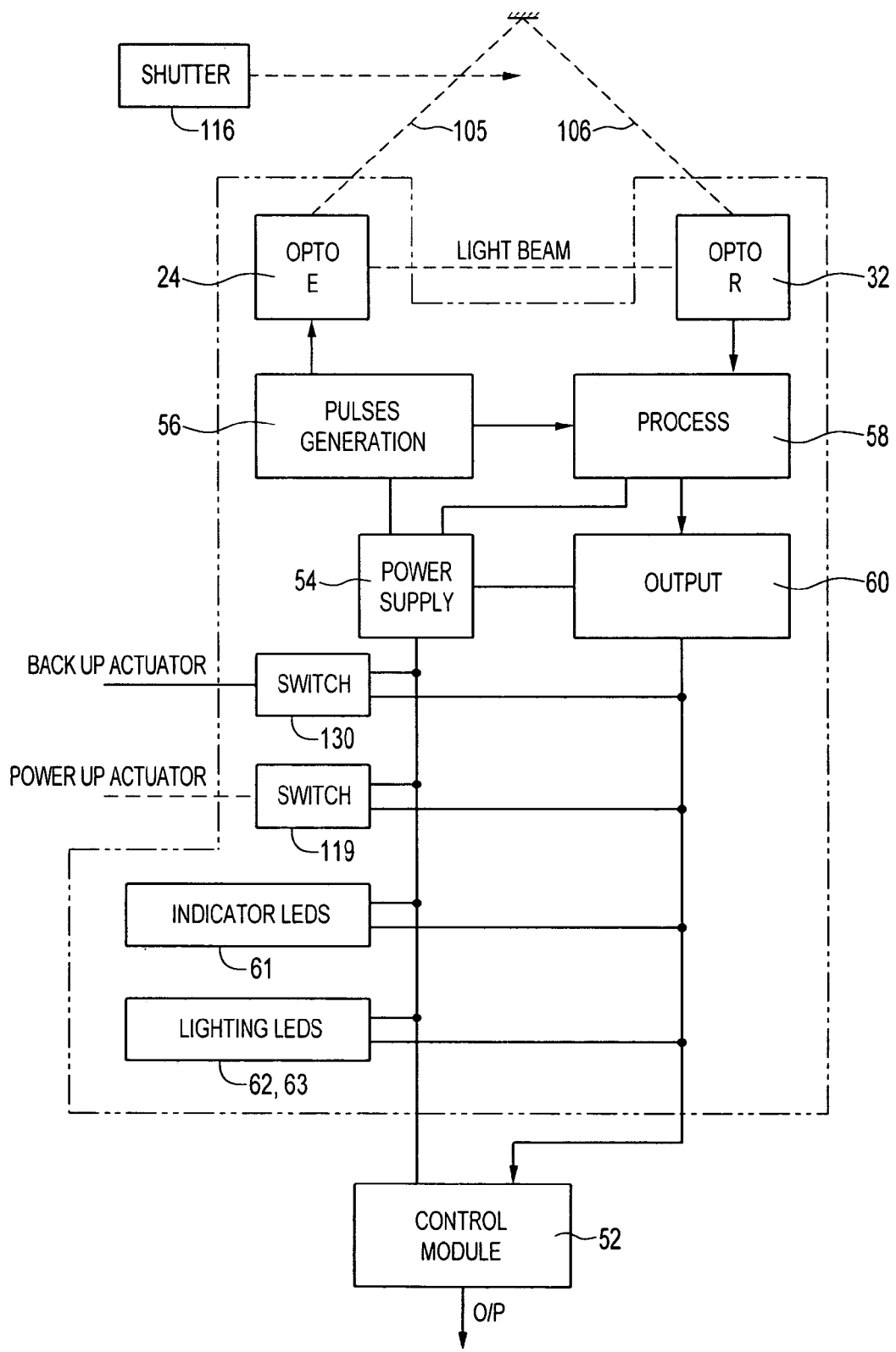
FIG. 5 illustrates a block diagram of the circuit used in the passive entry sensor system for interfacing with a control module of a vehicle.

An electromagnetic radiation emitter in the form of an IR LED 24 for transmitting the beam 105 and an electromagnetic detector in the form of an IR photo-detector 32, or other appropriate detector for detecting the beam 106, are located with associated circuitry within the optical enclosure 120,121 (See FIG. 5). The optical lens assembly 120 incorporates offset lenses 125,126 which serve to direct the beam 105 from the IR LED out of the enclosure to the reflector 107 and re-directs the reflected beam 106 back to the detector.

In this particular embodiment, the sensor can be configured in a static periscope arrangement in which an upper portion of the optical enclosure 120,121 is mounted in a cavity 122 formed in the handle end via an aperture 123 formed in the door skin 111, such that the lenses 125, 126 are located above the door skin and the beams 105,106 can be transmitted along the length of the handle. The optical enclosure 120,121 includes a sidewall carrying a pair of snap members 113 which are retractable to allow the sensor to be snap-fitted to the door skin 111 with the upper portion of the optical enclosure protruding through the door skin aperture 123 into the cavity 122. Once the optical sensor is fitted in its operating position, the snap members 113 return to their original position and is supported by the optical enclosure thereby providing support strength to the members and preventing the optical sensor from coming loose during normal conditions.

A signal processor, mounted in the optical enclosure, can be electrically coupled to the IR LED and the photo-detector and is configured to detect an interruption of the beam and provide an output control signal to the control module to enable the control module to verify the identity of the user and accordingly unlock the door.

Figure 3:
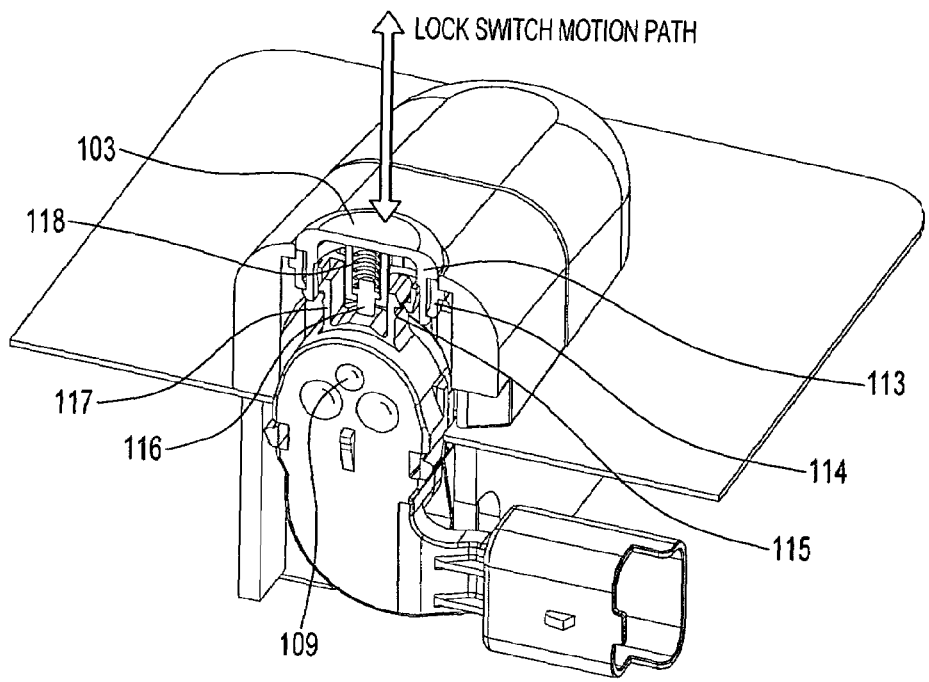
FIG. 3 illustrates a cut-away view of the locking switch and part of the optical enclosure mounted as shown in FIG. 2.

Referring to FIG. 3, which illustrates a cut-away view of the locking switch and part of the optical enclosure mounted as shown in FIG. 2, the locking switch 103 includes a switch member comprising a translucent optical cap 113 snap-fitted into a cap carrier 114 snap-fitted (i.e., slideable) to the top of the optical enclosure such that the cap protrudes from the front of the handle for depression by a user. A snap detent mechanism 115 is formed integrally at the top of the optical enclosure such that latching members formed on the inside of the carrier 114 can engage the snap detent mechanism 115 to locate the carrier in a partially depressed position when the optical cap is sufficiently depressed by the user. A translucent mechanical plunger 116 (light-pipe) is located within the carrier 114. The plunger 116 allows light to be transmitted from the optical enclosure 120, 121 through the translucent optical cap 113 and provides part of the return mechanism for the shutter assembly. The carrier 114 serves as an actuable shutter for controlling the transmission of the beam being transmitted from the optical enclosure of the sensor according to the extent of depression of the cap by the user.

In this particular embodiment, partially depressing the optical cap to locate the carrier in the snap detent, causes the carrier 114 to slide into the emitted beam 105, 106 and change transmission of the beam by attenuating the beam by about 20%. A recess spring 118 is designed to return the carrier 114 and plunger 116 to their original position after depression of the cap 113 such that full transmission of the beam is resumed. This brief optical attenuation is detected by the photo-detector to thereby flag the sensor 101. When the sensor is flagged in this manner, the sensor provides an output control signal to a control module, such as the CPU of the vehicle, for locking the door.

If necessary, the carrier 114 could be designed to flag the sensor more than once and the sensor 101 arranged to respond accordingly. For example, the sensor can be flagged twice by dimensioning the carrier 114 end such that, after initially attenuating the beam, the carrier 114 moves out of the beam upon further depression of the cap 113 and then re-interrupts the beam when being returned to its original starting position by the return spring 118. Alternatively, the carrier 114 could be arranged to change transmission of the beam by blocking the beam completely and the sensor configured to detect such change in transmission.

By providing an independent optical locking switch 103 that is operable by the user for locking the door, the functionality of the sensor system is improved. Moreover, utilizing the cap carrier 114 in the locking switch to interrupt or change the beam transmission such that the sensor 101 detects actuation of the locking switch, obviates the need to utilize a microswitch and associated circuitry to provide the output control signal for locking the door. Consequently, this arrangement simplifies construction of the passive entry sensor system reducing manufacturing costs and increasing the life time of the senor.

Figure 4:
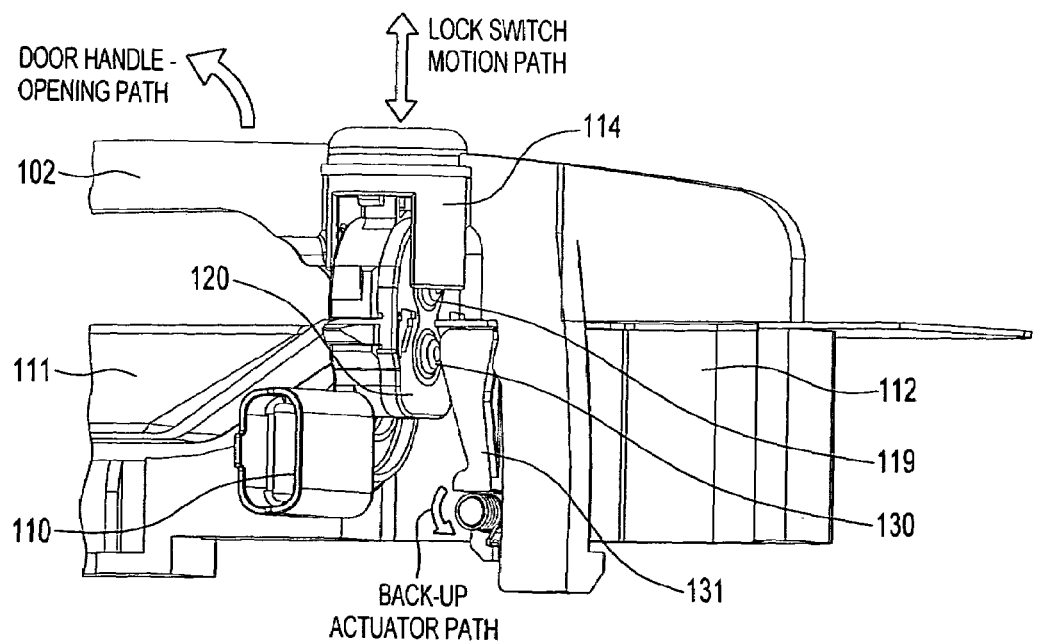
FIG. 4 illustrates a cut-away view of the handle end, taken longitudinally of the handle, incorporating the sensor and locking switch shown in accordance with the first embodiment.

Referring to FIG. 4, which illustrates a cut-away view of the handle end, taken longitudinally of the handle, incorporating the sensor and locking switch shown in accordance with the first embodiment, a power-up switch 119 is incorporated in the sensor 101 for providing a signal to the control module to power up the passive entry system if the system is in a standby mode. The power-up switch includes an electrical switch, mounted inside the optical enclosure 120, 121, coupled to a power-up button which button is arranged on the exterior of the optical enclosure cover 121 such that, as the carrier 114 is fully depressed by the user, the button is operable by a free end of the carrier sliding onto the button to actuate the power-up switch 119. The power-up switch provides the sensor with yet further functionality and is advantageous in that the switch can be used by the user to power-up the passive entry sensor system only when operation of the system is required thereby enabling power consumption of the system to be conserved.

A back-up switch 130 is also included in the sensor to provide an output control signal to the control module for unlocking the door in the event that the change in transmission of the beam caused by a user's hand actuating the handle is not detected by the optical sensor 101 for some reason. The back-up switch 130 includes a back-up button mounted on the exterior side of the cover 120 and an actuator flap 131 rotatably mounted to the handle bracket 112 such that the free end of the flap rotates onto the back-up button in response to the handle 102 being pulled by the user. The actuator flap 131 is spring loaded to return the flap to its rest position once handle motion has ceased.

Indicators, such as multi-colored light emitting diodes (LEDs) 61 (See FIG. 5), are mounted inside the optical enclosure 120, 121 and optically coupled to the locking switch cap 113 via the translucent plunger 116 for illuminating the cap to indicate one or more system modes, such as alarm activated, right-left turn vehicle indication, locked or unlocked door status. The indicator LEDs are electrically connected to the control module via the connector 110 such that the LEDs can be selectively activated by the control module to provide the desired system indication. Also mounted in the sensor is a back light LED 62, optically coupled to a lens 109 located on the front of the optical lens assembly 121, for illuminating the door handle aperture, and a ground light LED 63, optically coupled to a lens located in the side of the optical enclosure and aligned with an aperture 104 formed in the side of the handle end, for illuminating the ground below the door handle (See FIGS. 1 & 5). Both back and ground light LEDs are connected to the control module via the connector 110 such that the LEDs can be activated by the control module to provide back and ground lighting.

Reference will now be made to FIG. 5, which illustrates a block diagram of the circuit used in the passive entry sensor system 100 for interfacing with a control module of the vehicle. The circuit is coupled to current power supply 54 which supplies power to the main circuit components of the sensor 101; pulse generator circuitry 56; signal processing circuit 58 including the signal processor, for processing the output from the photo-detector 32, output circuit 60 for providing an output control signal to the control module 52, back-up and power-up switches 130, 119, indicator and back and ground light LEDs, 61, 62, 63.

The control module can control activation of the indicator LEDs 61 and back and ground light LEDs 62, 63 as required. In this case, the circuit is arranged so that the IR LED 24 provides a pulsed beam and the processor detects the presence or absence of a predetermined number of pulses. A pulse generator 56 generates pulses at a rate of 1 KHz and the frequency signal is fed to the IR LED 24 and to the signal processing circuitry 58 to synchronize detection of signals by the photo-detector 32. As long as both sets of pulses are received, a counter in the processing circuitry 58 is continually reset to zero and the output circuitry 60 does not generate an output signal.

When the light beam 105, 106 is interrupted such that a predetermined number of light pulses are not received by the photo-detector, the signal processing circuitry 58 detects this and actuates the output circuitry 60 to generate an output signal to the control module 52 for unlocking the door. Details concerning the circuitry used to generate the pulsed IR signal, for detecting the reflected signals and also for detecting when the reflected signal is interrupted are disclosed in U.S. Patent Publication No. US2004/0031908 which is incorporated herein by reference. Alternatively, the circuit can be arranged so that the IR LED 24 provides a continuous beam and the processor detects the absence of the continuous beam at the photo-detector 32 for a predetermined period.

The signal processing circuitry is also configured to detect attenuation of the emitted beam 105 received by the photo-detector 32. When the light beam 105 is attenuated by the locking switch cap carrier 114, say by 20%, the signal processing circuitry detects this attenuation and actuates the output circuitry to generate the output signal to the control module for locking the door.

The method of operating the passive entry system arranged in a door handle of a vehicle according to the first embodiment will now be described with reference to FIGS. 1, 3, 5. Initially the vehicle door is locked and the passive entry sensor system is powered ready for operation. In this condition, the back and ground light LEDs 62, 63 in the sensor 101 are activated so that the ground and the door panel beneath the handle 102 are illuminated and the indicator LEDs 61 are illuminated such that the locking switch cap 113 is illuminated red indicating to the user that the door is locked.

When the user initially inserts his hand in the handle aperture between the handle 102 and the door skin 111 to open the door, the beam is interrupted. The signal processor circuitry 58 detects this interruption and interprets this as an authorized user wishing to open the door. The processor transmits a control signal to the control module 52 which then generates an RF signal for interrogating the user's digital ID on a card. A response from the user is received and provided to the control module. If a suitable response is received confirming the ID of a user, the control module 52 sends a signal to unlock the door. This response time is typically 3.0 to 3.5 milliseconds (MS) and by the time the user pulls the door handle, the door is already unlocked.

Unlocking the door causes the control module to selectively activate indicator LEDs 61 so that the locking switch cap 113 is illuminated green indicating to the user that the door is unlocked. When the user desires to lock the door, the user partially depresses the locking switch cap 113 on the handle 101 moving the cap carrier 114 into the emitted beam 105, 106 to attenuate the beam briefly until the shutter returns to is original position. The signal processing circuit detects this change in attenuation and interprets this as a user wishing to lock the door.

The processor transmits another output control signal to the control module 52 which then locks the door. As a result, the control module selectively activates the indicator LEDs 62 so that the locking switch cap 113 is again illuminated red indicating to the user that the door is locked. If the user activates the vehicle left or right turn indicators while driving, the control module selectively activates the LEDs in the sensor to illuminate the locking cap amber intermittently on the corresponding left/right handle. Additionally, setting the vehicle alarm causes the control module 52 to selectively activate the indicator LEDs 61 to illuminate the locking cap red intermittently to indicate to the user that the vehicle alarm is set.

If initially the vehicle door is locked and the passive entry sensor system 100 is in standby mode and the user wishes to operate the system, the user power-ups the system by fully depressing the locking switch cap 113 so that the carrier 114 actuates the power-up button and triggers the power-up switch 119. The sensor 101 transmits a signal to the control module which, in turn, sends a response signal to the output circuitry to power up the power supply of the passive entry system. Additionally, the control module activates the back and ground light LEDs 62, 63 in the sensor 101 to illuminate the ground and the door panel beneath the handle 102 and selectively activates the indicator LEDs 61 so that the locking switch cap 113 is illuminated red indicating to the user that the door is locked. The user can then unlock the door by inserting his hand in the handle aperture beneath the handle 101. The processor detects the change in transmission caused by either of these actions and transmits a signal to the control module to unlock the door.

Beam configurations other than those described in the first embodiment can be utilized in alternative embodiments. By way of example, reference will now be made to FIG. 6, which illustrates a perspective view of a passive entry sensor system 200 arranged in a door handle according to a second embodiment. In this example, the sensor optical enclosure is arranged about the center of the handle 202 such that the optical sensor 201 can emit the beam 205 through a rear aperture of the handle 202 at an angle towards the door and can detect the beam 206 reflected by a reflective surface located on the door beneath the handle.

The sensor optical enclosure is connected via a wire harness to the connector 210 which connector can be left floating or insert molded into the end of the handle. Mounting the optical enclosure in this manner facilitates easy and rapid assembly of the sensor in the handle without substantial modification of the handle. In this embodiment, the indicator LEDs located in the optical enclosure are arranged to illuminate a window integrally formed in the enclosure which window is disposed in a front aperture of the handle 202. The back and side light LEDs are arranged to illuminate lenses disposed in rear and side handle apertures located at the handle center.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. For example, the skilled man would understand that the passive entry sensor system can be used in a variety of applications other than vehicles, such as buildings, containers and other environments in which access control is necessary. Also, the skilled man would understand that the sensor and systems of the embodiments described herein could be used without a reflector mounted on the door handle or door whereby reflection of the beam could be caused by a user's hand inserted in the handle.

Figure 6:
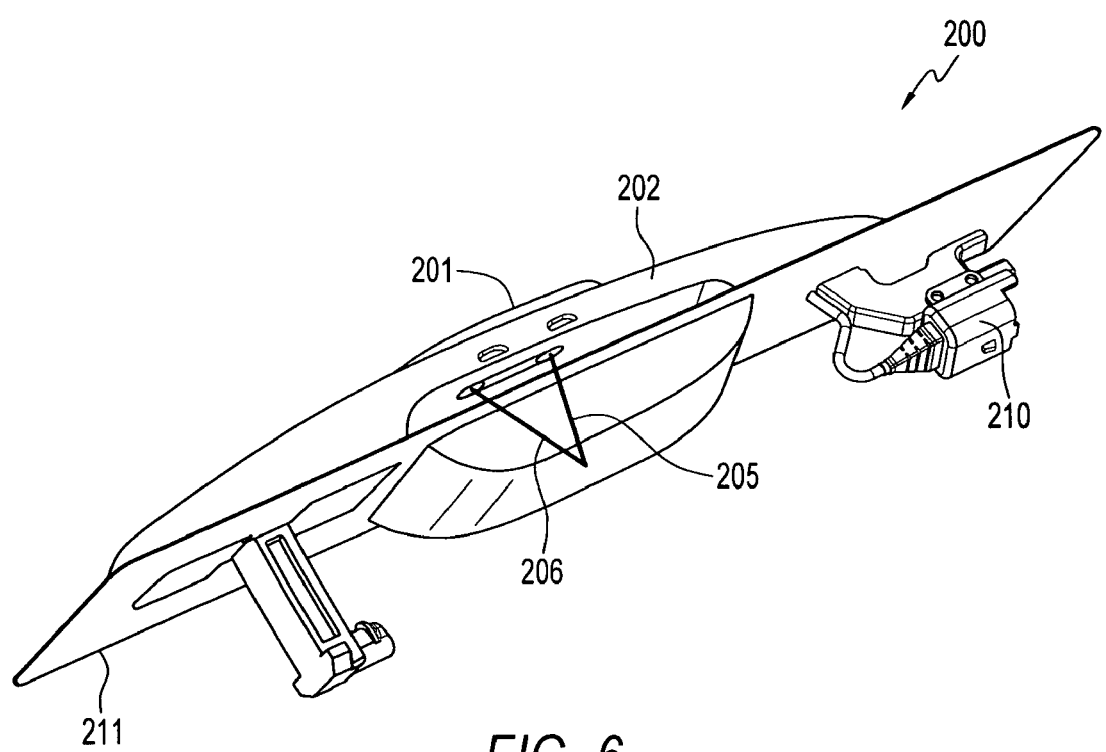
FIG. 6 illustrates a passive entry sensor system in which the sensor is arranged in the center of the handle according to a second embodiment.

Additionally, one skilled in the art can appreciate that the locking switch shutter may be configured to intercept the beam at any location along the beam path and need not be configured, as in the embodiment described herein, to intercept the beam within the optical enclosure. Also, the sensor circuitry could be configured to detect the presence of the beam rather than the absence of the beam. Furthermore, a one skilled in the art would understand that the sensor, locking switch, power-up switch and other components described herein could be mounted in handles of different configurations to those of the described embodiments. For example, one skilled in the art would understand that the locking switch and power up switch can be utilized in conjunction with sensors which provide alternative beam configurations, such as for example a beam configuration as shown in FIG. 6 of the accompanying drawings.

The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

The invention claimed is:

1. A passive entry sensor system for use with a keyless access control system, comprising:
   a sensor comprising an electromagnetic radiation emitter for transmitting a beam of electromagnetic radiation and an electromagnetic radiation detector for detecting the electromagnetic radiation beam, said emitter and detector being located in an optical enclosure of said sensor, wherein at least a portion of said optical enclosure is locatable in a handle such that the sensor can detect at least a partial interruption or other change in transmission of the beam caused by a user actuating the handle to open a door;
   a power-up switch for actuation by a user to provide a signal to a control module to power up said system; and
   an independent optical locking switch comprising a shutter for intercepting the beam, said sensor being configured to detect at least a partial interruption or other change in transmission of the beam caused by actuation of the shutter; wherein said independent locking switch includes a switch member, for actuation by a user, operatively coupled or connected to said shutter and said power-up switch such that movement of said switch member to a first position moves said shutter to flag the sensor and such that movement of said switch member to a second position triggers said power-up switch.

2. The system of claim 1, wherein said sensor further includes at least one indicator LED optically mounted in said optical enclosure and optically coupled to said switch member for illuminating said switch member to indicate to a user at least one system mode in response to a signal from a control module.

3. The system of claim 1, wherein said sensor includes a signal processor coupled to said detector such that said processor detects the change in beam transmission caused by the user actuating said locking switch and such that said processor detects the change in transmission caused by the user actuating the handle to open the door, said processor providing associated output control signals to an access control mechanism for controlling the operation of a locking device.

4. The system of claim 1, wherein said power-up switch comprises an electrical switch mounted inside said optical enclosure and a power-up button arranged on an exterior of said optical enclosure such that, as said switch member is fully depressed by the user, said power-up switch is operable by a free end of said switch member sliding onto said power-up button to mechanically actuate the power-up button.

5. The system of claim 1, wherein said shutter is operatively mountable to the handle or sensor whereby said shutter can be actuated to intercept the beam within the optical enclosure to change transmission of the beam and thereby flag the sensor at least once.

6. The system of claim 1, wherein said shutter is made from a material such that the beam is sufficiently attenuated by the shutter intercepting the beam to enable the sensor to detect said attenuation.

7. The system of claim 1, wherein said optical enclosure is locatable at one end of a door handle whereby the emitted beam can be transmitted along the length of the handle and reflected back for detection by the sensor.

8. The system of claim 7, including a beam reflector for reflecting the emitted beam, said reflector being locatable at an opposing end of said handle such that the detector can detect the reflected emitted beam.

9. The system of claim 1, further comprising
a handle; and
wherein said sensor is located in an optical enclosure mounted in a cavity formed in an end of said handle such that said beams can be transmitted along the length of said handle.

10. The system of claim 1, wherein the sensor includes a back-up switch for detecting handle motion, said back-up switch providing an output control signal to an access control mechanism in response to actuation of the back-up switch by movement of said handle in the event of the sensor failing to detect a user actuating the handle; wherein said back-up switch includes a back-up button mounted on the exterior side of said optical enclosure and an actuator flap rotatably mountable to a bracket of said handle such that, in use, said actuator flap is rotatable onto the back-up button in response to the handle being pulled by the user.

11. A method for providing keyless access to a door structure using a system, the method comprising the steps of:
generating a beam of electromagnetic radiation,
providing an optical enclosure in at least a portion of a handle of a door handle assembly,
providing a power-up switch for actuation by a user to provide a signal to a control module to power up said system, and
providing an independent optical locking switch comprising a shutter for intercepting the beam, wherein said independent locking switch includes a switch member coupled to said shutter and said power up switch,
transmitting from said optical enclosure said electromagnetic radiation beam along the length of a handle or between the handle and a door,
moving said shutter to flag a sensor in the system in response to said switch member moving to a first position,
triggering said power-up switch in response to movement of said switch member to a second position,
at least partially interrupting the beam by actuating the handle,
sensing at least a partial interruption of the beam or other change in transmission of the beam caused by the user actuating the handle,
generating a first output signal in response to sensing said change in beam transmission caused by actuating the handle,
processing said first output signal to provide an actuation signal, and sending said actuation signal to an access control mechanism to unlock said door.

12. A comma has been inserted after the phrase "depressing said switch member" on line 6 of the claim.

13. The system of claim 2, wherein said switch member includes a translucent plunger adapted and arranged to allow light to be transmitted from said optical closure through said switch member.

* * * * *

UNITED STATES PATENT AND TRADEMARK OFFICE
CERTIFICATE OF CORRECTION

| | | |
|---|---|---|
| PATENT NO. | : 7,375,613 B2 | Page 1 of 1 |
| APPLICATION NO. | : 11/157896 | |
| DATED | : May 20, 2008 | |
| INVENTOR(S) | : Michael J. Shelley et al. | |

It is certified that error appears in the above-identified patent and that said Letters Patent is hereby corrected as shown below:

In Column 12, line 46 claim 20, delete "A comma has been inserted after the phrase "depressing said switch member" on line 6 of the claim." and insert --A method of claim 11 wherein providing said power-up switch comprises mounting an electrical switch inside said optical enclosure and arranging a power-up button on the exterior of said optical enclosure,
      sliding a free end of said switch member onto said power-up button to mechanically actuate the power-up button and operate said power-up switch in response to depressing said switch member,
      at least partially interrupting or changing the beam transmission by intercepting the beam with a shutter,
      sensing at least a partial interruption or other change in beam transmission caused by a user actuating a shutter to intercept the beam,
      generating a second output signal in response to sensing said change in beam transmission caused by actuating the shutter,
      processing said second output signal to provide a second actuation signal, and sending said actuation signal to an access control mechanism to lock said door.--

Signed and Sealed this

Thirtieth Day of September, 2008

JON W. DUDAS
*Director of the United States Patent and Trademark Office*